US009355989B2

(12) United States Patent
Lin et al.

(10) Patent No.: US 9,355,989 B2
(45) Date of Patent: May 31, 2016

(54) WIRE BONDING DEVICE AND METHOD OF ELIMINATING DEFECTIVE BONDING WIRE

(71) Applicant: Siliconware Precision Industries Co., Ltd., Taichung (TW)

(72) Inventors: Wei-Sheng Lin, Taichung (TW); Lien-Chen Chiang, Taichung (TW); Lung-Tang Hung, Taichung (TW); Meng-Hung Yeh, Taichung (TW); Yude Chu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/584,463

(22) Filed: Dec. 29, 2014

(65) Prior Publication Data

US 2016/0079198 A1 Mar. 17, 2016

(30) Foreign Application Priority Data

Sep. 11, 2014 (TW) .............................. 103131301 A

(51) Int. Cl.
*H01L 23/49* (2006.01)
*H01L 23/00* (2006.01)
*B23K 20/00* (2006.01)

(52) U.S. Cl.
CPC .............. *H01L 24/43* (2013.01); *B23K 20/004* (2013.01); *H01L 24/78* (2013.01); *H01L 2224/437* (2013.01); *H01L 2224/43985* (2013.01); *H01L 2924/3701* (2013.01); *H01L 2924/386* (2013.01)

(58) Field of Classification Search
CPC ....... H01L 24/745; H01L 24/78; H01L 24/43; H01L 24/48; H01L 24/45
See application file for complete search history.

(56) References Cited

U.S. PATENT DOCUMENTS

2012/0302009 A1* 11/2012 Sekihara et al. .............. 438/121

* cited by examiner

*Primary Examiner* — Jose R Diaz
(74) *Attorney, Agent, or Firm* — Mintz Levin Cohn Ferris Glovsky and Popeo, P.C.; Peter F. Corless; Steven M. Jensen

(57) ABSTRACT

A method of eliminating a defective bonding wire is provided, including moving a bonding member from a first region of a carrier to a second region of the carrier if the bonding wire of the bonding member is defective, and cooperatively operating a movement member and the bonding member so as to cause the defective bonding wire to be removed from the bonding member and bonded to the second region of the carrier, thereby auto-debugging the bonding member and improving the production efficiency.

10 Claims, 7 Drawing Sheets

WIRE BONDING DEVICE AND METHOD OF ELIMINATING DEFECTIVE BONDING WIRE

BACKGROUND OF THE INVENTION

1. Field of the Invention

The present invention relates to wire bonding devices and debugging methods, and more particularly, to a wire bonding device and a method of debugging the wire bonding device.

2. Description of Related Art

A conventional wire bonding process for a semiconductor package generally involves using gold wires to electrically connect a chip and a carrier such as a lead frame or a substrate. FIGS. 1A to 1F are schematic views showing a conventional wire bonding process. Referring to FIGS. 1A and 1B, a plurality of bonding points 111 and a bonding member 21 are provided. The bonding member 21 outputs a bonding wire 110 and the bonding wire 110 is bonded to a first one of the bonding points 111. Referring to FIGS. 1C and 1D, the bonding member 21 is then moved to a second one of the bonding points 111 so as to cause the bonding wire 110 to electrically connect the first and second bonding points 111. Finally, referring to FIGS. 1E and 1F, the bonding wire is cut. The bonding member 21 is moved back to its original position and a new ball is formed for another wire bonding process.

However, referring to FIGS. 2A to 2C, when an undesired material F (for example, silicon powder residue or too thick aluminum oxide) is formed on a bonding point 111' or an abnormal ball formation (for example, too big, too small or deformed ball formation) occurs, it easily leads to a poor eutectic bonding between the ball and the bonding pad of the chip, thus causing a ball lift problem. Referring to FIG. 2C, if such a ball lift problem occurs, an effective electrical connection cannot be formed between the defective bonding wire and the bonding point 111'. In addition, the undesired material F is attached to the bonding wire. As such, the bonding member automatically stops working and calls for help. In other words, the bonding member needs to be repaired before performing a subsequent wire bonding process, thus adversely affecting operation of the production line and consequently reducing the product efficiency.

Therefore, how to overcome the above-described drawbacks has become critical.

SUMMARY OF THE INVENTION

In view of the above-described drawbacks, the present invention provides a wire bonding device, which comprises: a carrier having a first region used for performing a wire bonding process and a second region positioned outside the first region; a bonding member for receiving a bonding wire; and a movement member for moving the bonding member to the first region of the carrier so as to perform the wire bonding process, wherein if the bonding wire is defective, the movement member and the bonding member are cooperatively operated so as to cause the defective bonding wire to be removed from the bonding member and bonded to the second region of the carrier.

The present invention further provides a method of eliminating a defective bonding wire, which comprises the steps of: providing the above-described wire bonding device; moving the bonding member to the second region of the carrier if the bonding wire of the bonding member is defective; and cooperatively operating the movement member and the bonding member so as to cause the defective bonding wire to be removed from the bonding member and bonded to the second region of the carrier.

In the above-described method, cooperatively operating the movement member and the bonding member can comprise bending the defective bonding wire so as to cause the defective bonding wire to be removed from the bonding member and bonded to the second region of the carrier.

In the above-described device and method, the bonding member can comprise a nozzle for outputting the bonding wire and a clamp for holding the bonding wire.

In the above-described device and method, the carrier can comprise a plurality of carrying members, and the first region and the second region are positioned on different ones of the carrying members.

In the above-described device and method, the second region of the carrier can have a bondable block for debugging the bonding member. In an embodiment, the bondable block is made of a Ni/Au alloy. In another embodiment, the bondable block is a substrate having a Ni/Au alloy layer.

The above-described device can further comprise a sensor for sensing whether the bonding wire of the bonding member is defective.

According to the present invention, if a defective bonding wire occurs to the bonding member, the movement member and the bonding member are cooperatively operated to cause auto-debugging of the bonding member through the second region of the carrier, thereby improving the production efficiency.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 1A:
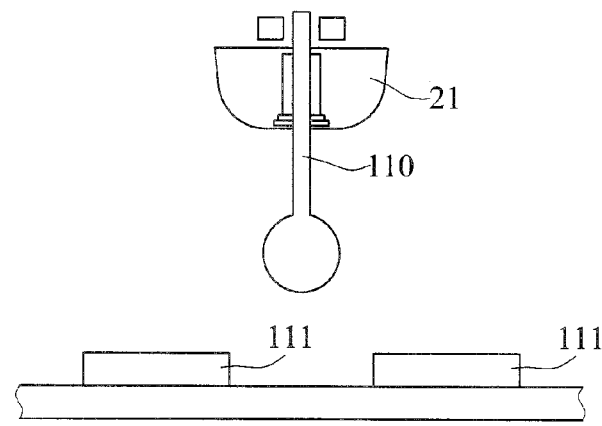
FIGS. 1A to 1F are schematic views showing a conventional wire bonding process.
Figure 1B:
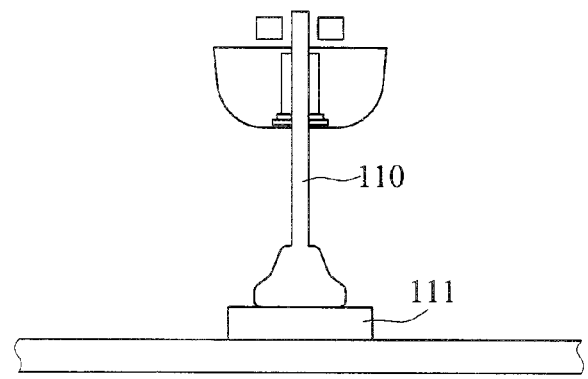
Figure 1C:
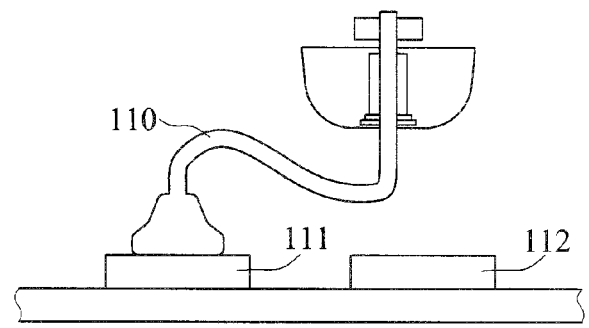
Figure 1D:
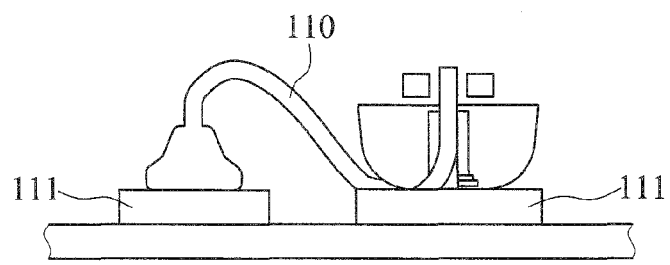
Figure 1E:
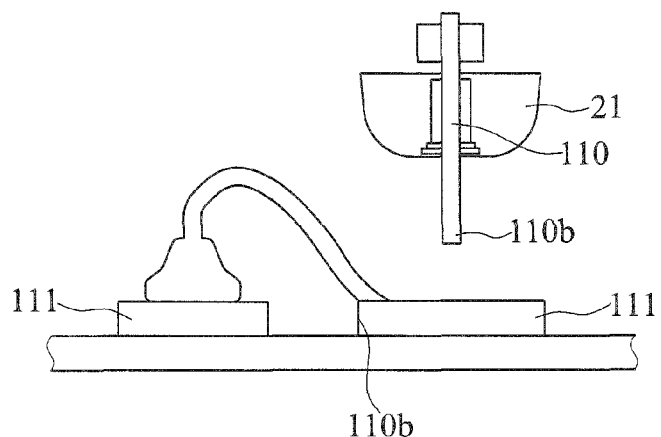
Figure 1F:
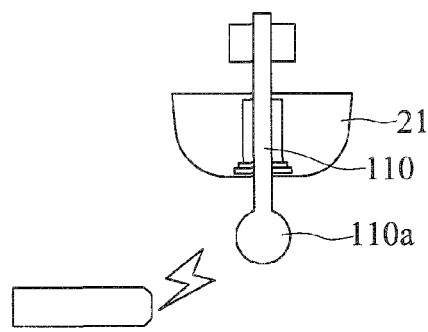
Figure 2A:
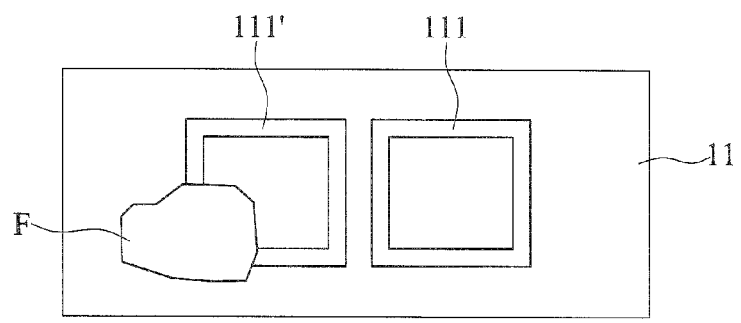
FIGS. 2A to 2C are schematic views showing a conventional abnormal wire bonding process.
Figure 2B:
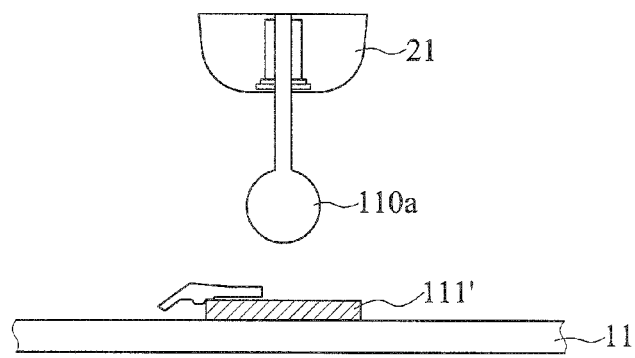
Figure 2C:
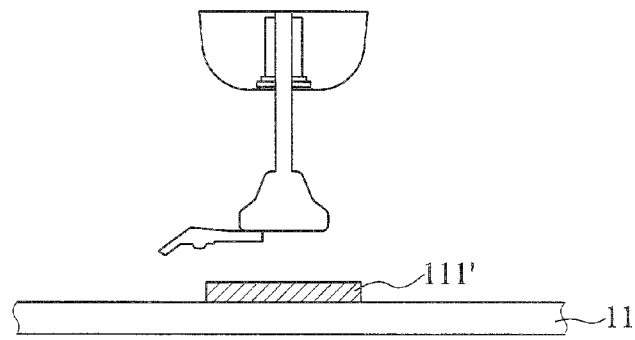
Figure 3A:
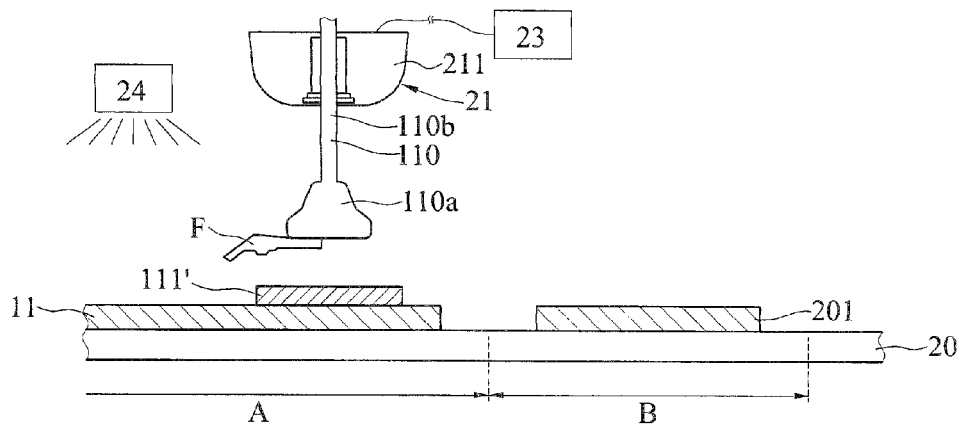
FIGS. 3A to 3H are schematic views showing a method of eliminating a defective bonding wire according to the present invention.

FIG. 3A is a schematic view of a wire bonding device of the present invention. Referring to FIG. 3A, the wire bonding device has: a carrier 20 having a first region A used for performing a wire bonding process and a second region B positioned outside the first region A; a bonding member 21 for receiving a bonding wire; and a movement member 23 for moving the bonding member 21 to the first region A of the carrier 20 so as to perform the wire bonding process. Further, if the bonding wire 110 is defective, the movement member 23 and the bonding member 21 are cooperatively operated to cause the defective bonding wire 110 to be removed from the bonding member 21 and bonded to the second region B of the carrier 20.

In the present embodiment, at least an electronic element 11 is disposed on the carrier 20. The electronic element 11 has a plurality of bonding points 111'. The bonding member 21 is used to output a bonding wire for electrically connecting any two of the bonding points 111'. The electronic element 11 is a substrate, a semiconductor chip, an interposer, or a packaged or unpackaged semiconductor element.

The movement member 23 is, but not limited to, a robotic arm or a track.

The bonding member 21 has a nozzle 211 for outputting the bonding wire.

The wire bonding device further has a sensor 24 for sensing the defective bonding wire 110 of the bonding member 21.

FIGS. 3A to 3H are schematic views showing a method of eliminating a defective bonding wire 110 according to the present invention.

Referring to FIG. 3A, the sensor 24 senses the defective bonding wire 110 of the bonding member 21.

The defective bonding wire 110 has a bonding end 110a for bonding with the bonding point 111' and a tail end 110b opposite to the bonding end 110a. In the present embodiment, the defective bonding wire 110 has an undesired material F attached to the bonding end 110a.

Although the present embodiment debugs the wire bonding device that has a ball lift problem caused by the undesired material F, it should be noted that the present invention is not limited thereto.

Further, a bondable block 201 is formed in the second region B of the carrier 20 so as to facilitate elimination of the defective bonding wire 110. Preferably, the bondable block 201 is made of a material capable of producing a good eutectic bonding with the bonding wire. For example, the bondable block 201 is a Ni/Au alloy layer formed in the second region B of the carrier 20. Alternatively, the bondable block 201 is a BT (Bismaleimide Triacine) substrate having a Ni/Au alloy layer thereon.

Figure 3B:
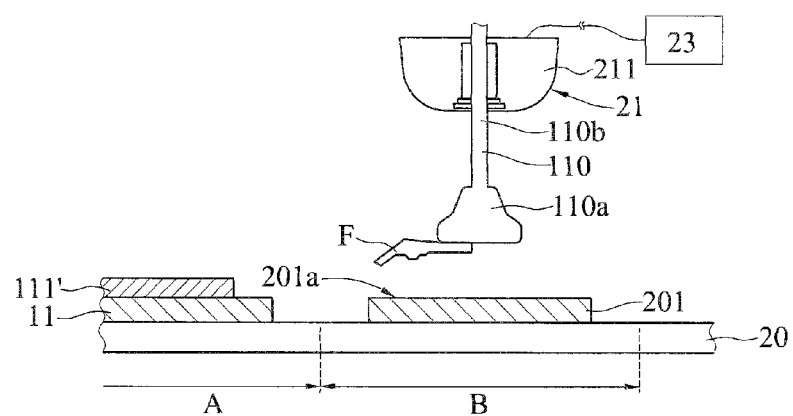

Referring to FIG. 3B, the bonding member 21 is moved by the movement member 23 to the second region B of the carrier 20.

In the present embodiment, a first bonding point 201a is defined on the bondable block 201.

Figure 3C:
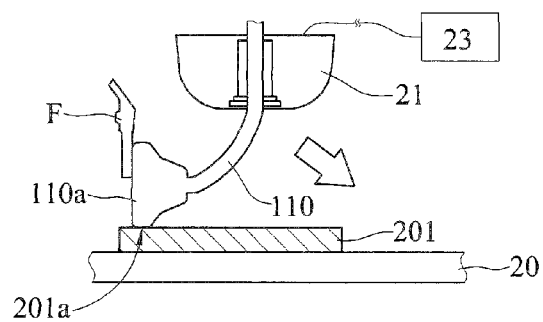

Referring to FIG. 3C, the bonding member 21 is moved by the movement member 23 so as to cause the bonding end 110a of the defective bonding wire 110 to come into contact with the first bonding point 201a of the bondable block 201. Then, the bonding member 21 is moved obliquely downward (in an arrow direction of FIG. 3C). As such, the bonding end 110a of the defective bonding wire 110 is changed into an erect state.

In the present embodiment, the bonding member 21 can be moved in any direction (front, back, left and right) above the first bonding point 201a of the bondable block 201.

Figure 3D:
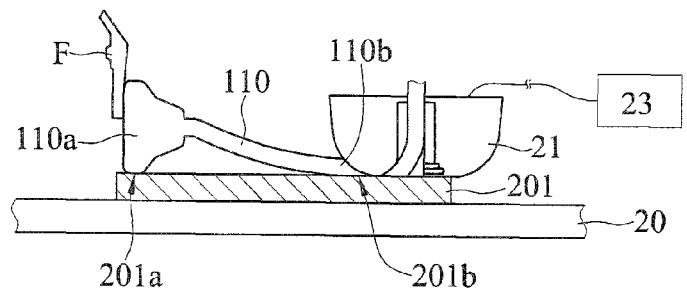

Referring to FIG. 3D, a second bonding point 201b is defined on the bondable block 201 in the second region B of the carrier 20. The bonding member 21 is continuously moved obliquely downward to abut against the second bonding point 201b of the bondable block 201, and the tail end 110b of the defective bonding wire 110 comes into contact with the second bonding point 201b of the bondable block 201.

In the present embodiment, the second bonding point 201b is defined at the right of the first bonding point 201a. But it should be noted that there is no special limitation on the position of the second bonding point 201b. Further, the first and second bonding points 201a, 201b can be positioned on same or different bondable blocks.

Figure 3E:
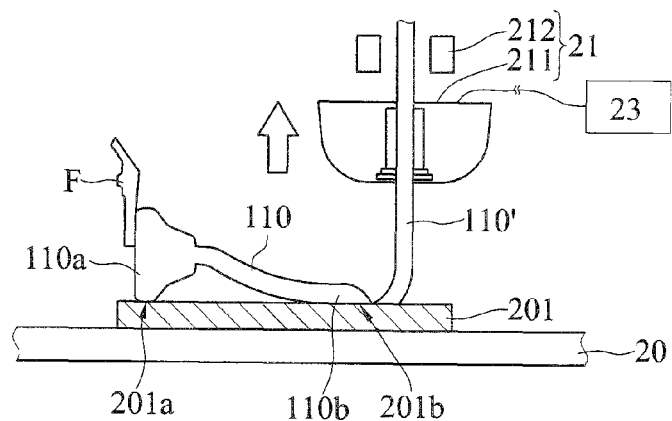

Referring to FIG. 3E, after the tail end 110b of the defective bonding wire 110 comes into contact with the second bonding point 201b of the bondable block 201, the bonding member 21 cuts the tail end 110b of the defective bonding wire 110, and the bonding member 21 is moved away from the bondable block 201 by the movement member 23 (in an arrow direction of FIG. 3E).

In the present embodiment, the defective bonding wire 110 is removed by bending, as shown in FIGS. 3C to 3E.

Further, the bonding member 21 has a clamp 212 for holding the bonding wire.

Figure 3F:
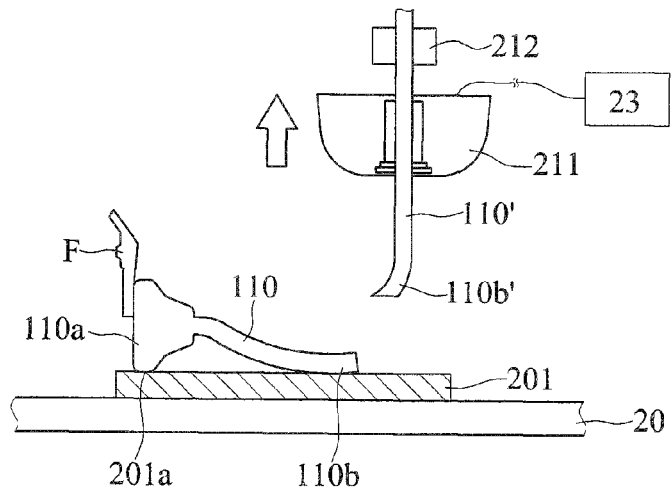

Referring to FIG. 3F, a normal bonding wire 110' is held by the clamp 212 and the bonding member 21 is moved by the movement member 23 (in an arrow direction of FIG. 3F) so as to form a tail end 110b' of the bonding wire 110'.

Figure 3G:
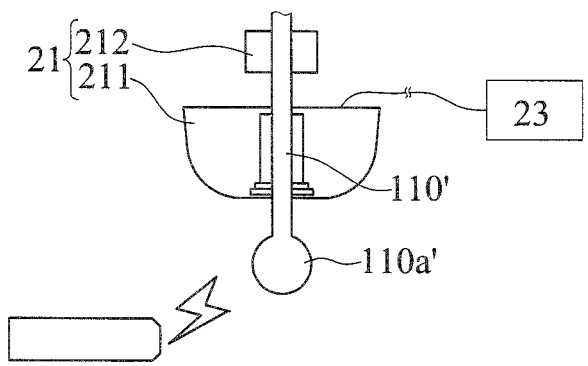
Figure 3H:
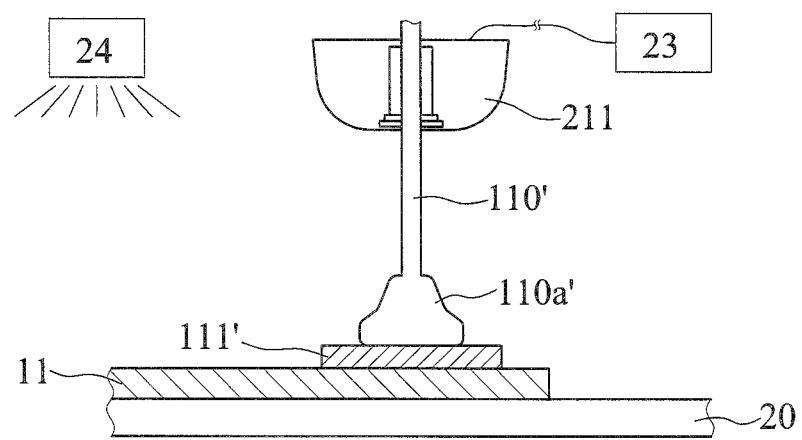

Referring to FIGS. 3G and 3H, the tail end 110b' of the bonding wire 110' is heated to form a bonding end 110a' so as for a new wire bonding process to be performed.

In the present embodiment, the bonding wire 110' is heated at the original position of the wire bonding device.

Figure 4:
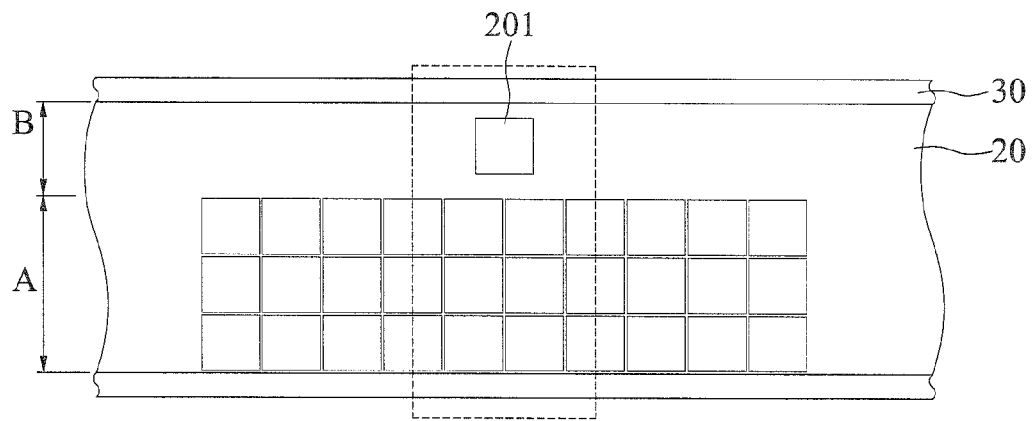
FIGS. 4 and 4' are schematic upper views showing application of a wire bonding device of the present invention in a continuous production process, wherein FIG. 4' shows another embodiment of FIG. 4.
Figure 4:
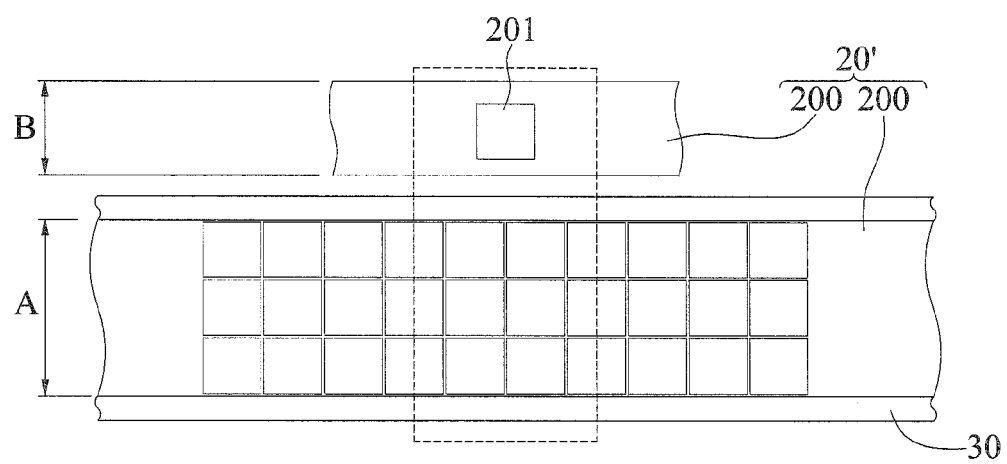

FIGS. 4 and 4' are schematic upper views showing application of the wire bonding device of the present invention in a continuous production process. Referring to FIGS. 4 and 4', the wire bonding device further has a conveyor 30 used for transporting electronic elements 11 to a processing region (indicated by a dashed line box). The movement member (not shown) of the present invention can move the bonding member (not shown) to the first region A for performing such as a wire bonding process or to the second region B for performing elimination of a defective bonding wire. The carrier 20 can be a single carrier 20, as shown FIG. 4, or a carrier 20' having a plurality of carrying members 200, as shown in FIG. 4'. Further, referring to FIG. 4', the first region A carrying the electronic elements 11 and the second region B having the bondable block 201 can be positioned on different carrying members 200.

According to the present invention, if the bonding member malfunctions, the movement member and the bonding member are cooperatively operated to cause auto-debugging of the bonding member, thereby improving the production efficiency.

Further, the bondable block can be made of any metal material that can easily bond with the bonding wire or made of the same material as the bonding points.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A wire bonding device, comprising:
    a carrier having a first region used for performing a wire bonding process and a second region positioned outside the first region;
    a bonding member for receiving a bonding wire; and
    a movement member for moving the bonding member to the first region of the carrier so as to perform the wire bonding process, wherein when the bonding wire is defective, the movement member and the bonding member are cooperatively operated so as to cause the defective bonding wire to be removed from the bonding member and bonded to the second region of the carrier.

2. The device of claim 1, further comprising a sensor for sensing whether the bonding wire of the bonding member is defective.

3. The device of claim 1, wherein the bonding member comprises:
 a nozzle for outputting the bonding wire; and
 a clamp for holding the bonding wire.

4. The device of claim 1, wherein a bondable block is formed in the second region of the carrier for debugging the bonding member.

5. The device of claim 1, wherein the carrier comprises a plurality of carrying members and the first region and the second region are positioned on different ones of the carrying members.

6. A method of eliminating a defective bonding wire, comprising the steps of:
 providing a wire bonding device of claim 1;
 moving the bonding member to the second region of the carrier when the bonding wire of the bonding member is defective; and
 cooperatively operating the movement member and the bonding member so as to cause the defective bonding wire to be removed from the bonding member and bonded to the second region of the carrier.

7. The method of claim 6, wherein cooperatively operating the movement member and the bonding member comprises bending the defective bonding wire so as to cause the defective bonding wire to be removed from the bonding member and bonded to the second region of the carrier.

8. The method of claim 6, wherein the bonding member comprises:
 a nozzle for outputting the bonding wire; and
 a clamp for holding the bonding wire.

9. The method of claim 6, wherein the second region of the carrier has a bondable block for debugging the bonding member.

10. The method of claim 6, wherein the carrier comprises a plurality of carrying members and the first region and the second region are positioned on different ones of the carrying members.

\* \* \* \* \*